US012660698B2

(12) United States Patent
Yu et al.

(10) Patent No.: US 12,660,698 B2
(45) Date of Patent: Jun. 16, 2026

(54) BOND HEAD WITH ELASTIC MATERIAL AROUND PERIMETER TO IMPROVE BONDING QUALITY

(71) Applicant: Taiwan Semiconductor Manufacturing Company, Ltd., Hsinchu (TW)

(72) Inventors: Chen-Hua Yu, Hsinchu City (TW); Chih-Hang Tung, Hsinchu (TW); Kuo-Chung Yee, Taoyuan City (TW); Yian-Liang Kuo, Hsinchu City (TW); Jiun-Yi Wu, Zhongli City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 549 days.

(21) Appl. No.: 18/166,116

(22) Filed: Feb. 8, 2023

(65) Prior Publication Data

US 2024/0096825 A1 Mar. 21, 2024

Related U.S. Application Data

(60) Provisional application No. 63/375,884, filed on Sep. 16, 2022.

(51) Int. Cl.
| | |
|---|---|
| *H10W 90/00* | (2026.01) |
| *H10W 72/00* | (2026.01) |
| *H10W 72/90* | (2026.01) |
| *H10W 74/01* | (2026.01) |

(52) U.S. Cl.
CPC ........... *H10W 90/00* (2026.01); *H10W 74/01* (2026.01); *H10W 72/01923* (2026.01); *H10W*

*72/07141* (2026.01); *H10W 72/07178* (2026.01); *H10W 72/981* (2026.01)

(58) Field of Classification Search
CPC ....... H01L 21/6838; H01L 2224/75314; H01L 2224/75315; H01L 2224/75316; H01L 2224/75318; H01L 2224/75743; H01L 2224/75745; H01L 24/75; H10P 72/78; H10P 72/7616; H10W 72/07141; H10W 72/07178

See application file for complete search history.

(56) References Cited

U.S. PATENT DOCUMENTS

| | | | | |
|---|---|---|---|---|
| 7,790,507 B2 * | 9/2010 | Okamoto | ................ | H01L 24/83 |
| | | | | 438/106 |
| 11,521,950 B2 * | 12/2022 | Kurosawa | ............. | H01L 21/563 |
| 2013/0255878 A1 * | 10/2013 | Takahashi | .............. | H05K 3/305 |
| | | | | 156/288 |
| 2016/0268226 A1 * | 9/2016 | Lim | ........................ | H01L 24/81 |

(Continued)

*Primary Examiner* — David A Zarneke

(74) *Attorney, Agent, or Firm* — McClure, Qualey & Rodack, LLP

(57) ABSTRACT

A bond head is provided. The bond head includes a bond base, a chuck member, and an elastic material. The chuck member protrudes from a surface of the bond base, and has a chuck surface formed with vacuum holes for holding a die using differential air pressure. In the direction parallel to the chuck surface, the width of the chuck surface is less than the width of the bond base and is equal to or greater than the width of the die. The elastic material is disposed over the chuck surface. The elastic material is arranged around the periphery of the chuck surface to cover edges and/or corners of the chuck surface.

20 Claims, 13 Drawing Sheets

(56)     References Cited

U.S. PATENT DOCUMENTS

| | | | | |
|---|---|---|---|---|
| 2019/0164931 | A1* | 5/2019 | Song | B23K 3/047 |
| 2020/0373275 | A1* | 11/2020 | Seyama | H01L 24/32 |
| 2021/0005570 | A1* | 1/2021 | Watanabe | H01L 24/83 |
| 2021/0233887 | A1* | 7/2021 | McClain | H01L 24/73 |

* cited by examiner

BOND HEAD WITH ELASTIC MATERIAL AROUND PERIMETER TO IMPROVE BONDING QUALITY

CROSS REFERENCE TO RELATED APPLICATIONS

This application claims the benefit of U.S. Provisional Application No. 63/375,884, filed on Sep. 16, 2022, the entirety of which is incorporated by reference herein.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area. As the demand for shrinking electronic devices has grown, a need for smaller and more creative packaging techniques of semiconductor dies has emerged.

As semiconductor technologies further advance, stacked semiconductor devices, e.g., three dimensional integrated circuits (3DIC), have emerged as an effective alternative to further reduce the physical size of a semiconductor device. In a stacked semiconductor device, active circuits such as logic, memory, processor circuits and the like are fabricated on different semiconductor wafers. Two or more package components (e.g., semiconductor wafers, dies or chips, interposers, etc.) may be stacked on top of one another to further reduce the form factor of the semiconductor device.

Although existing 3D packaging technologies for fabricating 3DIC devices have generally been adequate for their intended purposes, they have not been entirely satisfactory in all respects. Consequently, it would be desirable to provide a solution for improving the 3D packaging technology.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 3B-1 illustrates a bottom view of a bond head with a die attached thereto, in accordance with some alternative embodiments of the present disclosure.

FIG. 3B-2 illustrates a bottom view of a bond head with a die attached thereto, in accordance with some alternative embodiments of the present disclosure.

DETAILED DESCRIPTION

Figure 1A:
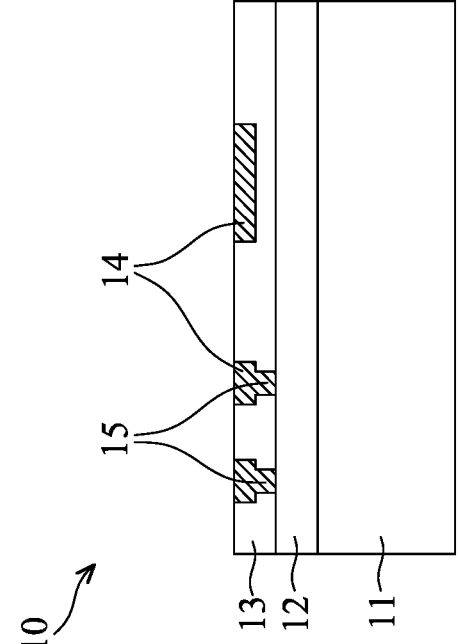
FIGS. 1A to 1D illustrate cross-sectional views of intermediate stages in the formation of an integrated circuit (IC) package, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Novel bond heads in accordance with some embodiments of the present disclosure are described. Some variations of the embodiments are also discussed. Throughout the various views and illustrative embodiments, like reference numbers are used to designate like elements.

According to various embodiments, a bond head for bonding a first package component (e.g., a die/chip) to a second package component (e.g., a wafer) is provided, wherein the bond head is larger in size (e.g., cross-section area) than the die to be attached, and has an elastic material around the periphery (e.g., edges and/or corners) of the bond head. The elastic material may be thermosetting plastic or thermoplastic, and may be attached to the bond head by adhesives, deposition process, or damascene process. Providing a larger bond head (than the attached die) can improve bonding quality by reducing bonding issues at the die edges or die corners. Additionally or alternatively, providing an elastic material around the periphery (e.g., edges and/or corners) of the bond head can prevent the bond head from impacting adjacent dies already mounted on the bottom wafer during the bonding process, which will lead to die damage and particle contamination, resulting in yield loss of the bonding process. Accordingly, the reliability of the bonding process and the resulting semiconductor device can thus be increased. In some cases where bond head shift occurs, the shifted bond head also compress the corners and edges of adjacent die(s) without damaging them (due to the provision of elastic material), which helps improve adjacent dies bonding quality.

Embodiments will be described with respect to a specific context, namely a bond head used for forming a 3DIC device/package, such as a chip-on-wafer (CoW) package. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed below as being performed in a particular order, other method embodiments contemplate steps that are performed in any logical order FIGS. 1A to 1D illustrate cross-sectional views of intermediate stages in the formation of an integrated circuit (IC) package, in accordance with some embodiments of the present disclosure. As shown in FIG. 1A, a first package component, such as an integrated circuit die 10, is provided. Integrated circuit dies 10 (for simplicity, only one die 10 is shown) will be packaged in subsequent processing to form IC packages. Each integrated circuit die 10 may be a logic die (e.g., central processing unit (CPU) die, graphics processing unit (GPU) die, microcontroller die, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), the like, or a combination thereof (e.g., a system-on-a-chip (SoC) die). The integrated circuit die 10 may be formed in a wafer (not shown), which may include different device regions that are singulated in subsequent steps to form a plurality of integrated circuit dies. The integrated circuit die 10 includes a semiconductor substrate 11, an interconnect structure 12, a dielectric layer 13, bonding pads 14, and conductive vias 15.

The semiconductor substrate 11 may be a substrate of silicon, doped or undoped, or an active layer of a semiconductor-on-insulator (SOI) substrate. The semiconductor substrate 11 may include other semiconductor materials, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not shown), such as transistors, diodes, capacitors, resistors, and the like, may be formed in and/or on an active surface (e.g., the surface facing upward) of the semiconductor substrate 11.

Conductive vias (not shown) may be formed to extend into the semiconductor substrate 11 from the active surface of the semiconductor substrate 11 in some cases. When initially formed, the conductive vias do not extend to an inactive surface (e.g., the surface facing downward, opposite the active surface) of the semiconductor substrate 11. In a subsequent step, a removal or thinning process, such as a chemical-mechanical polish (CMP) process, may be performed on the inactive surface of the semiconductor substrate 11 to expose the conductive vias. Accordingly, the devices or components on both sides of the semiconductor substrate 11 can communicate with each other through the conductive vias. The conductive vias are also sometime referred to as through-substrate vias or through-silicon vias (TSVs) when the semiconductor substrate 11 is a silicon substrate. The conductive vias may be formed by forming recesses in the semiconductor substrate 11 by, for example, etching, milling, laser techniques, a combination thereof, and/or the like. A thin dielectric material may be formed in the recesses, such as by using an oxidation technique. A thin barrier layer may be conformally deposited over the active surface of the semiconductor substrate 11 and in the openings, such as by chemical vapor deposition (CVD), atomic layer deposition (ALD), physical vapor deposition (PVD), thermal oxidation, a combination thereof, and/or the like. The barrier layer may be formed from an oxide, a nitride, or an oxynitride, such as titanium nitride, titanium oxynitride, tantalum nitride, tantalum oxynitride, tungsten nitride, a combination thereof, and/or the like. A conductive material may be deposited over the barrier layer and in the openings. The conductive material may be formed by an electrochemical plating (ECP) process, CVD, ALD, PVD, a combination thereof, and/or the like. Examples of conductive material are copper, tungsten, aluminum, silver, gold, a combination thereof, and/or the like. Excess of the conductive material and barrier layer is removed from the active surface of the semiconductor substrate 11 by, for example, a CMP. The conductive vias collectively include the barrier layer and conductive material, with the barrier layer between the conductive material and the semiconductor substrate 11.

The interconnect structure 12 is formed on the active surface of the semiconductor substrate 11 and over the conductive vias (if any). The interconnect structure 12 may include one or more dielectric layer(s) and respective metallization layer(s) in the dielectric layer(s). The dielectric layer(s) may be inter-metallization dielectric (IMD) layers.

The inter-metallization dielectric layers may be formed, for example, of a low-K dielectric material, such as undoped silicate glass (USG), phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, by any suitable method known in the art, such as spin-on coating, CVD, plasma-enhanced CVD (PECVD), high-density plasma chemical vapor deposition (HDP-CVD), or the like. The metallization pattern(s) in the dielectric layer(s) may route electrical signals between the devices of the semiconductor substrate 11, such as by using vias and/or traces, and may also contain various electrical devices, such as capacitors, resistors, inductors, or the like. The metallization pattern(s) may be formed from a conductive material such as copper, aluminum, the like, or combinations thereof. The various devices and metallization patterns may be interconnected to perform one or more functions. The functions may include memory structures, processing structures, sensors, amplifiers, power distribution, input/output circuitry, or the like. Additionally, connectors, such as conductive pillars or contact pads, are formed in and/or on the interconnect structure 12 to provide an external electrical connection to the circuitry and devices. The above examples are provided for illustrative purposes only, and other embodiments may utilize fewer or additional elements.

The dielectric layer 13 is formed over the interconnect structure 12. The dielectric layer 13 may include one or more layers of non-photosensitive dielectric materials such as silicon nitride, silicon oxide, or the like. In some embodiments, the dielectric layer 13 is subsequently used for bonding, and may be an oxide such as silicon oxide. The dielectric layer 13 may be formed using CVD, PVD, ALD, a spin-on coating process, a lamination process, a combination thereof, or the like.

The bonding pads 14 are formed in the dielectric layer 13 and are physically and electrically coupled to the interconnect structure 12 by the conductive vias 15. The bonding pads 14 and conductive vias 15 comprise a conductive material, which may b e a metallic material including a metal or a metal alloy such as copper, silver, gold, tungsten, cobalt, aluminum, or alloys thereof. In some embodiments, the bonding pads 14 and conductive vias 15 are formed using a dual damascene process. As an example of such a process, openings for the bonding pads 14 and conductive vias 15 may be formed in the dielectric layer 13, a thin seed layer is deposited in the openings, and the conductive material is filled in the openings using, for example, electrochemical-plating (ECP) or electro-less plating from the seed layer. A planarization process, such as a CMP, may be performed such that top surfaces of the bonding pads 14 and dielectric layer 13 are level.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
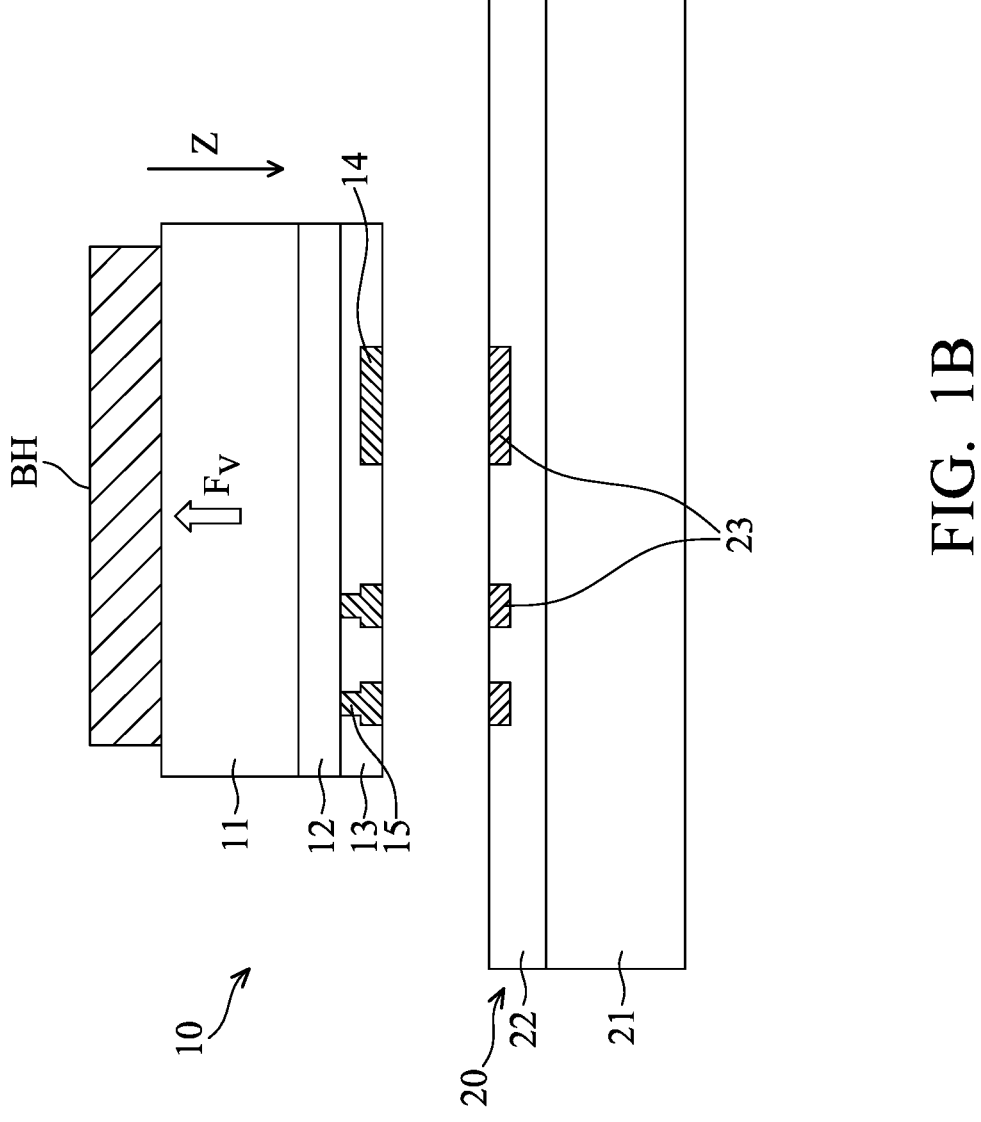

As shown in FIG. 1B, a second package component, such as a wafer 20, is provided. The wafer 20 includes a substrate 21, a dielectric layer 22, and bonding pads 23. The substrate 21 may be a semiconductor substrate, a glass substrate, a ceramic substrate, or the like. In some embodiments, the wafer 20 is a silicon wafer (i.e., the material of the substrate 21 includes silicon), such that multiple packages can be formed on the wafer 20 simultaneously. The dielectric layer 22 is formed on the substrate 21, and bonding pads 23 are formed in and exposed from the dielectric layer 22. The dielectric layer 22 and bonding pads 23 of the wafer 20 may be the same as or similar to the dielectric layer 13 and bonding pads 14 of the integrated circuit die 10 described above. The bonding pads 23 of the wafer 20 may correspond to the bonding pads 14 of the integrated circuit die 10. For example, after bonding the integrated circuit die 10 to the wafer 20 (see FIG. 1C), corresponding bonding pads 23 and bonding pads 14 can make electrical connections between the integrated circuit die 10 and the wafer 20.

FIG. 1B also illustrates that the integrated circuit die 10 is mounted on a bond head BH and placed over the wafer 20 by the bond head BH. The bond head BH, which is a part of a pick-and-place tool (not shown), is used to pick up and place the integrated circuit die 10 over the wafer 20. For example, the bond head BH may include vacuum channels (not shown) therein. Vacuum channels are connected to a vacuum pump (not shown) of the pick-and-place tool and can be used to create a vacuum environment therein, so that the bond head BH can be used to pick up the integrated circuit die 10 using the vacuum force $F_V$, and to place the integrated circuit die 10 over the wafer 20. More specifically, after the integrated circuit die 10 is picked up (with the dielectric layer 13 and bonding pads 14 facing down, i.e., facing the wafer 20), it can be moved by the bond head BH to a position where the bonding pads 14 of the integrated circuit die 10 correspond to the bonding pads 23 of the wafer 20, and then be lowered (in the Z-direction shown) until the integrated circuit die 10 contacts the wafer 20 (see FIG. 1C).

Figure 1C:
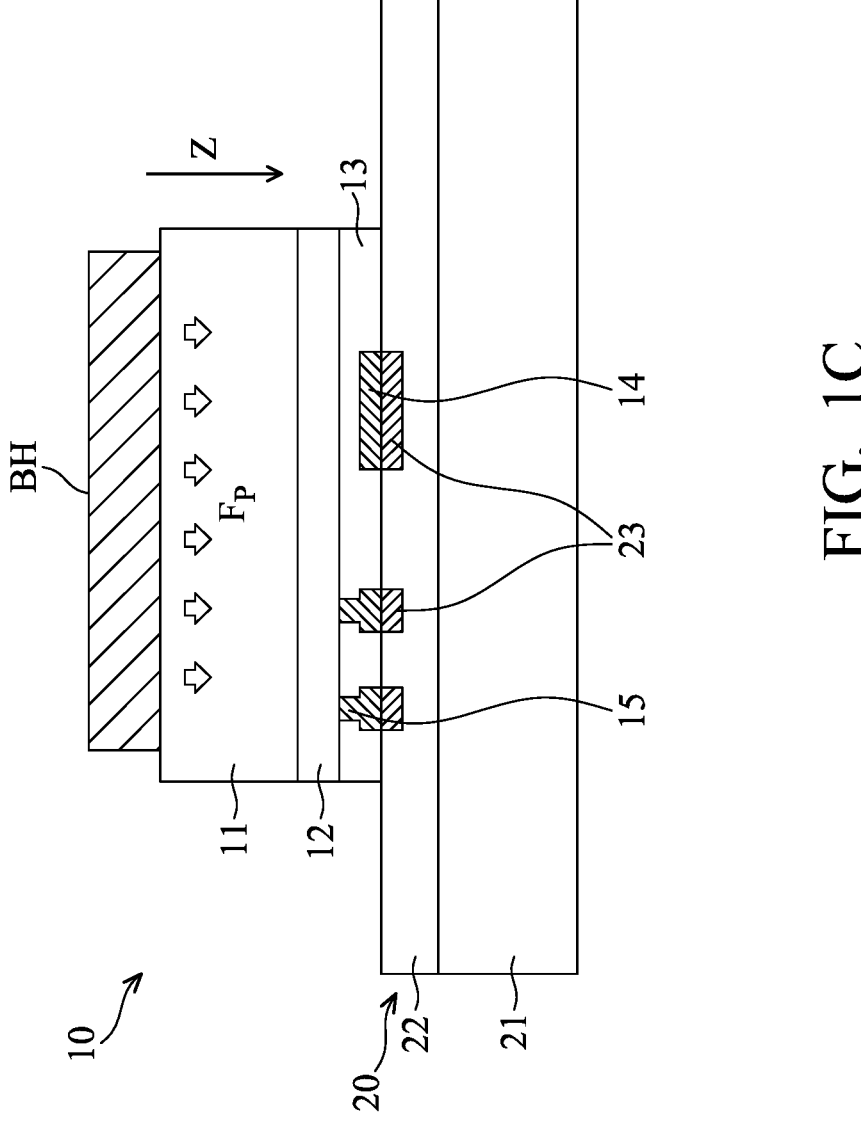

FIG. 1C illustrates that after the integrated circuit die 10 is placed on the wafer 20, the integrated circuit die 10 and wafer 20 are bonded together by the bond head BH. In some embodiments, the integrated circuit die 10 and wafer 20 are attached by hybrid bonding. Before performing the bonding, a surface treatment may be performed on the integrated circuit die 10 and wafer 20. The surface treatment may be a plasma treatment process, and the process gas used for generating the plasma may be a hydrogen-containing gas, which includes a first gas including hydrogen ($H_2$) and argon (Ar), a second gas including $H_2$ and nitrogen ($N_2$), or a third gas including $H_2$ and helium (He). Through the treatment, the number of OH groups at the surfaces of the dielectric layer 13 and 22 increases. Next, a pre-bonding process may be performed, where the integrated circuit die 10 and wafer 20 are pressed against together by the pressure $F_P$ applied by the bond head BH to form weak bonds between the dielectric layer 13 of the integrated circuit die 10 and the dielectric layer 22 of the wafer 20. After the pre-bonding process, the integrated circuit die 10 and wafer 20 are annealed to strengthen the weak bonds and form a fusion bond. During the annealing, the H of the OH bonds is outgassed, thereby forming Si—O—Si bonds between the integrated circuit die 10 and wafer 20, thereby strengthening the bonds. During the hybrid bonding, direct metal-to-metal bonding also occurs between the bonding pads 14 of the integrated circuit die 10 and the bonding pads 23 of the wafer 20. Accordingly, the resulting bond is a hybrid bond that includes the Si—O—Si bond and metal-to-metal direct bond. Other details of hybrid bonding are well known in the art and will not be described further here.

Figure 1D:
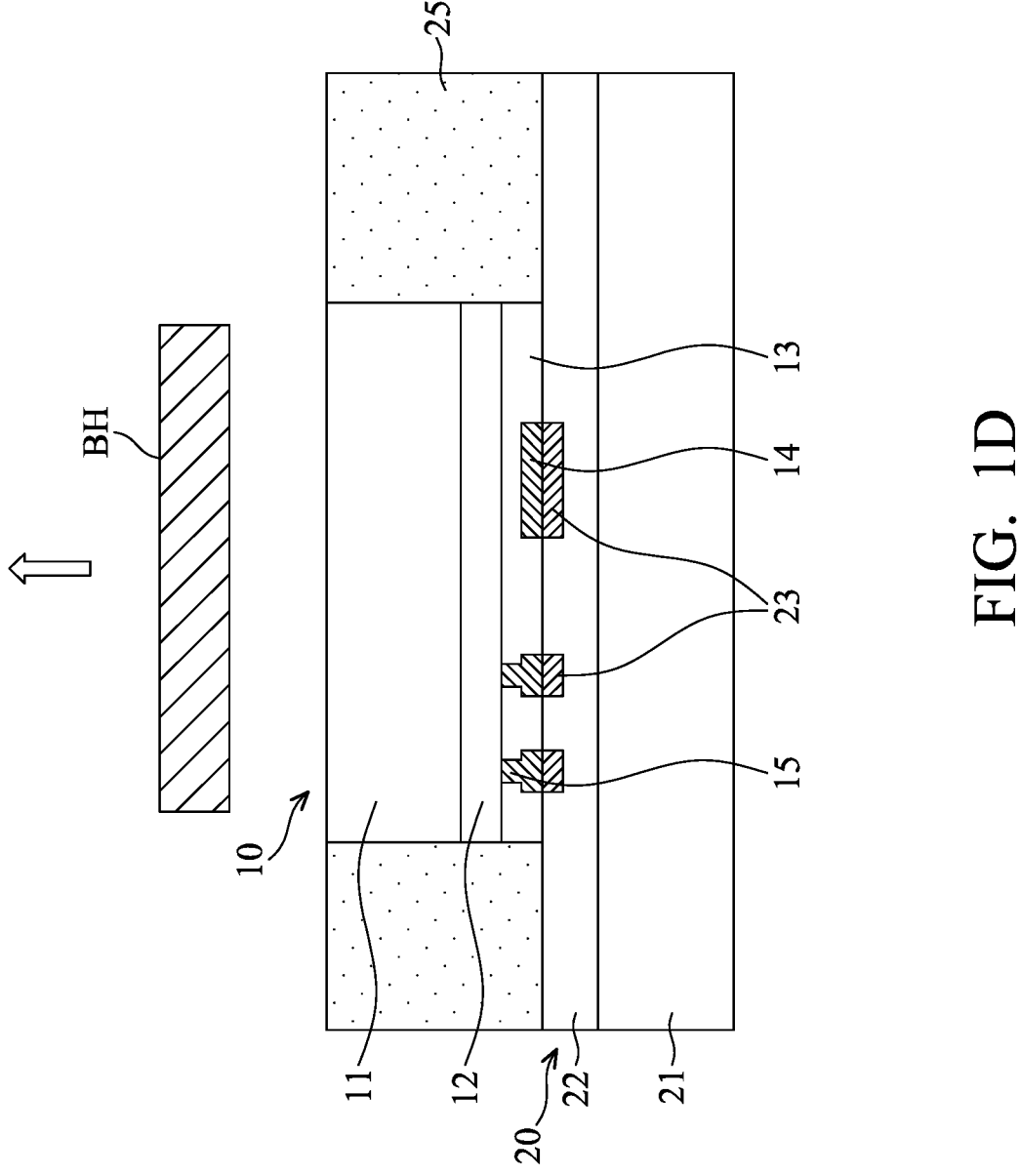

After the integrated circuit die 10 and wafer 20 are bonded together, the bond head BH is removed from the integrated circuit die 10, as shown in FIG. 1D.

Figure 2:
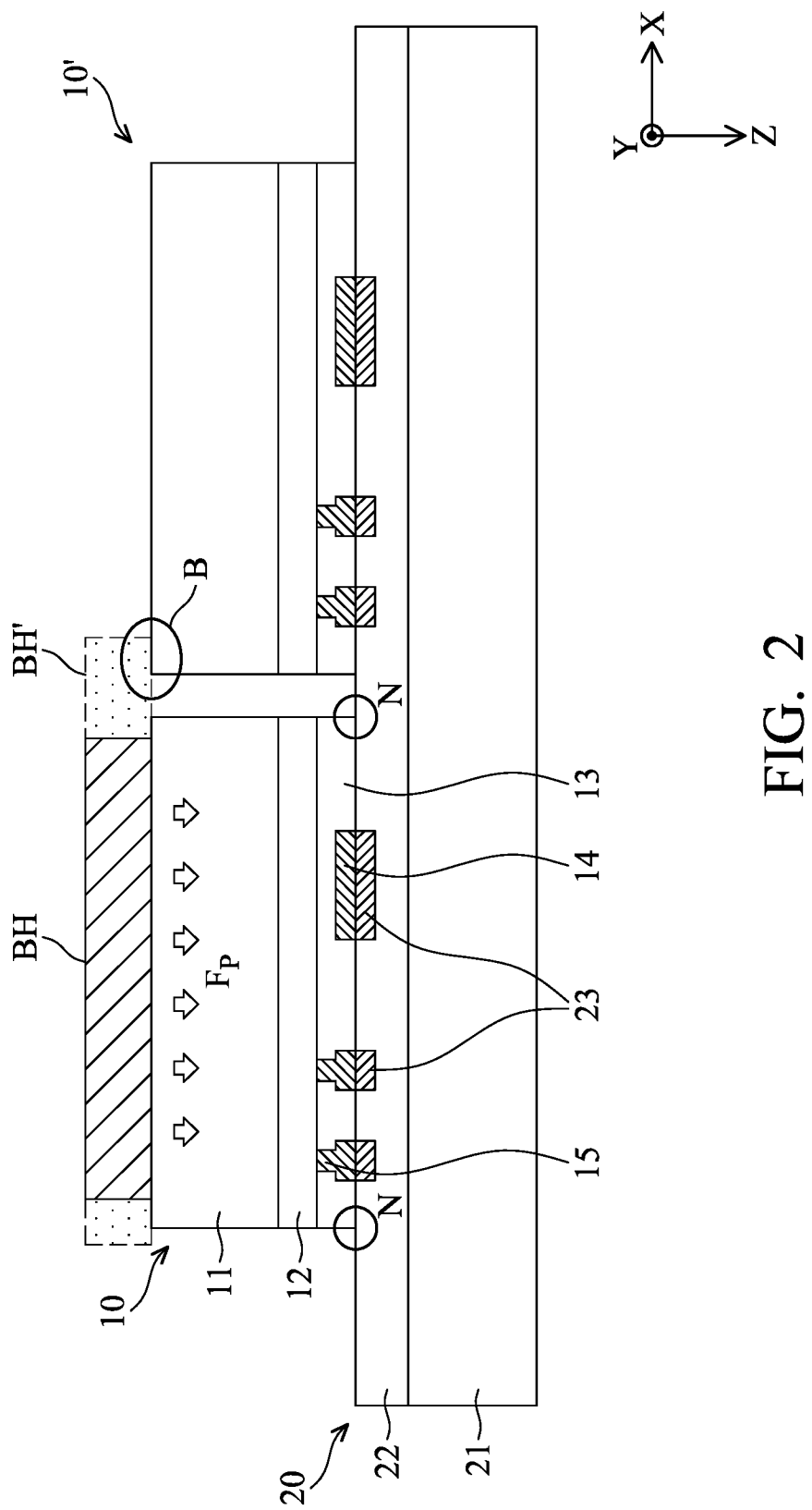
FIG. 2 illustrates bonding issues at the die edges or die corners or die bumping that can occur while bonding the top die to the bottom wafer.

It has been found that the size (e.g., the cross-sectional area) of the bond head will affect the quality of the bonding process. For example, FIG. 2 illustrates bonding issues at the die edges or die corners or die bumping that can occur during the (hybrid) bonding process. As shown in FIG. 2, if the size (e.g., the cross-sectional area, parallel to the X-Y plane) of the bond head BH is smaller than the size of the attached integrated circuit die 10 (see the left part of FIG. 2), the bond head BH will only contact the (central) portion of the integrated circuit die 10 and therefore cannot provide sufficient pressure $F_P$ at the die corners and die edges of the integrated circuit die 10. As a result, bonding issues at the die edges or die corners (as indicated by circles N) may be caused at the bonding interface between the integrated circuit die 10 and wafer 20, thereby degrading the bonding quality.

On the other hand, a bond head BH' (depicted in dashed lines) having the same or larger size (e.g., the cross-sectional area, parallel to the X-Y plane) than attached integrated circuit die 10 can help address the bonding issues at the die edges or die corners described above. However, as the density of bonded die on the wafer increases, this larger bonding head BH' is prone to impact (as indicated by circle B) and damage adjacent dies 10' already mounted on the wafer 20 during the bonding process (see the right part of FIG. 2), especially when bond head shift (relative to the attached integrated circuit die 10) occurs. Broken chips can lead to particle contamination, resulting in yield loss in the bonding process.

Accordingly, it is desirable to provide a novel bond head that can address the aforementioned bonding issues at the die edges or die corners and die bumping issues during the bonding process.

Figure 3A:
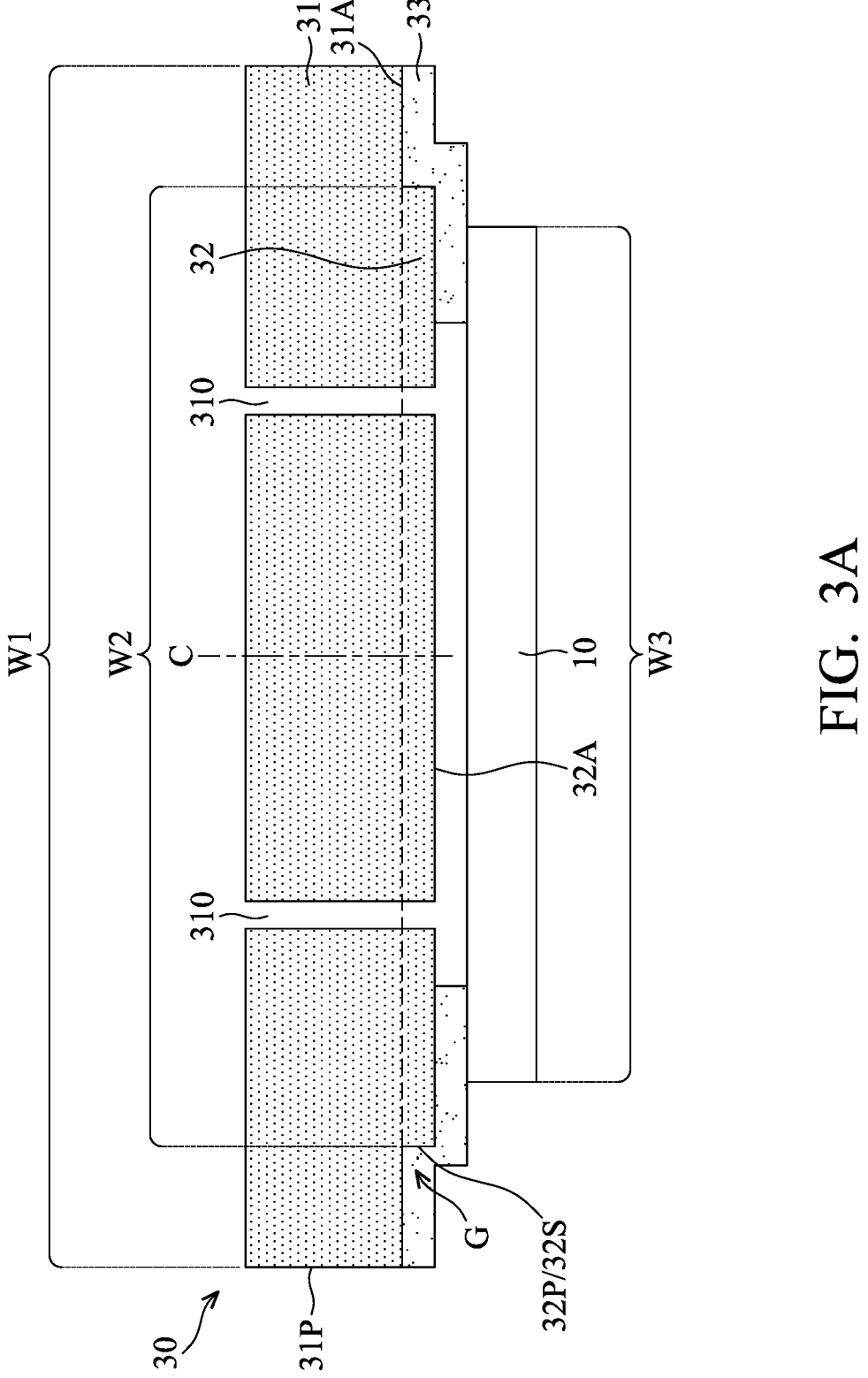
FIG. 3A illustrates a cross-sectional view of a bond head with a die attached thereto, in accordance with some embodiments of the present disclosure.
Figure 3B:
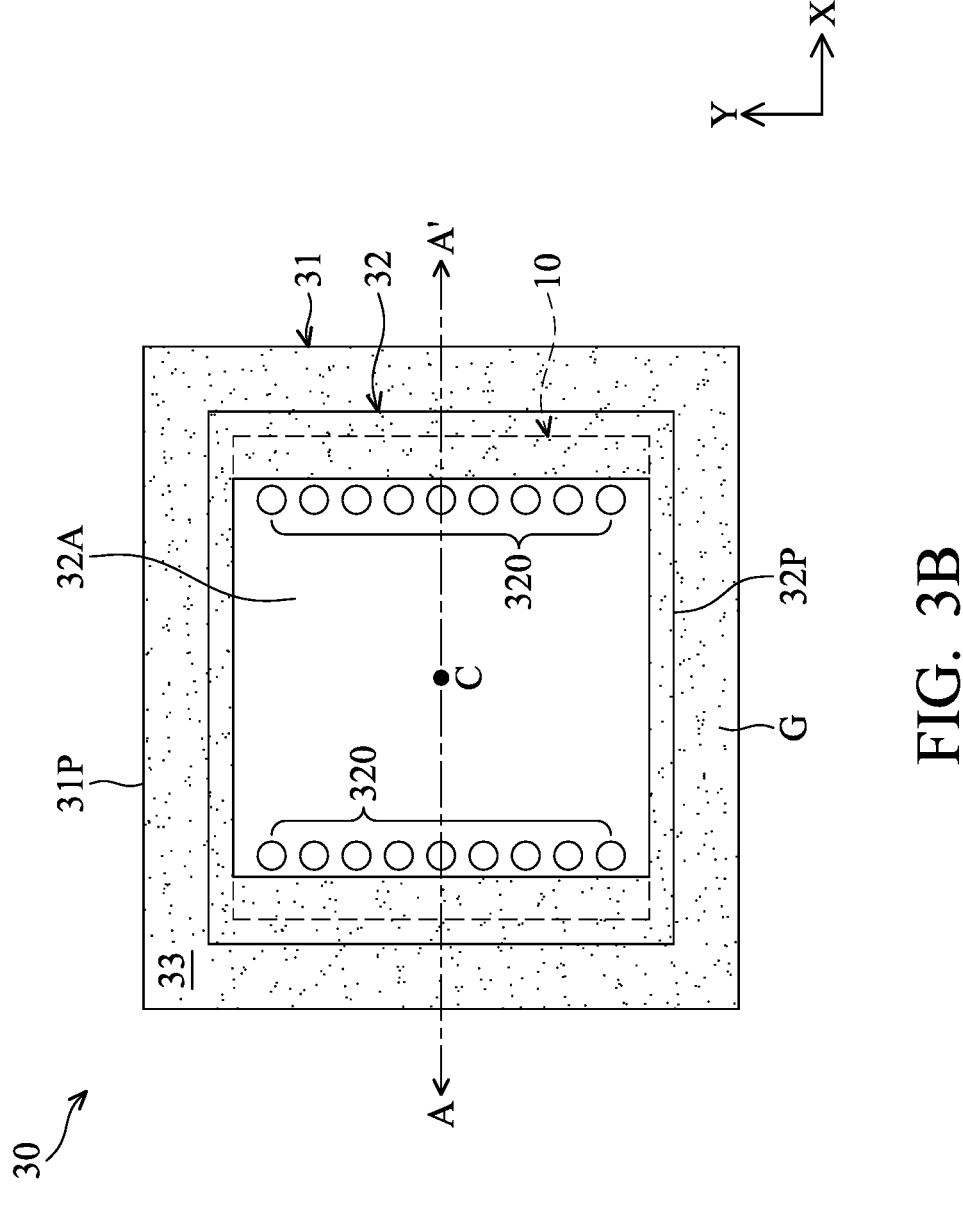
FIG. 3B illustrates a bottom view of a bond head with a die attached thereto, in accordance with some embodiments of the present disclosure.
Figures 2, 3B:
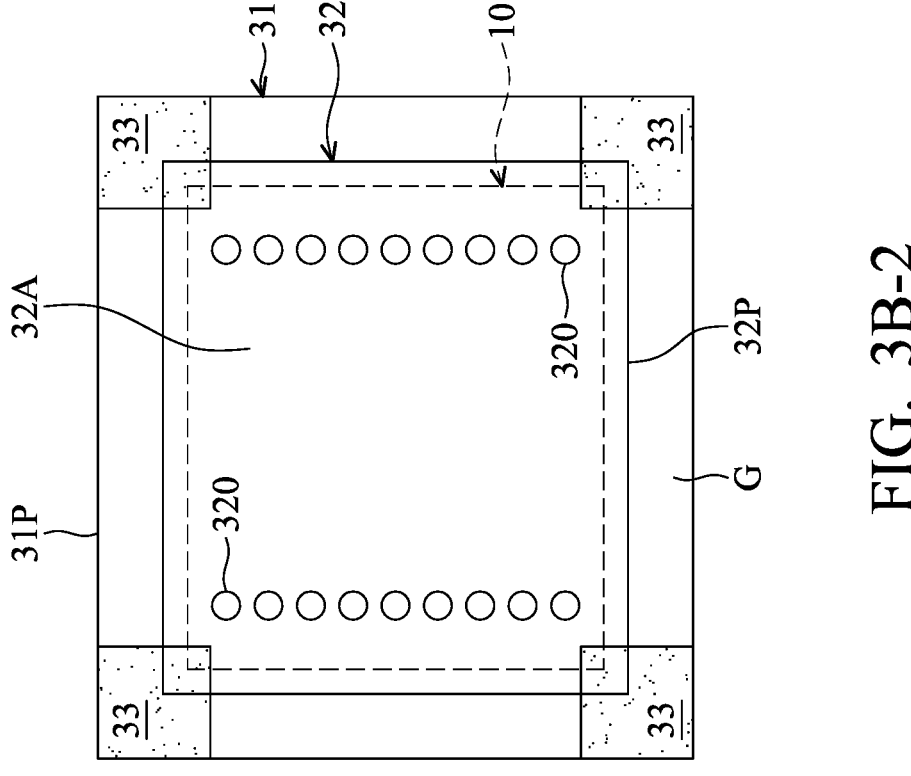

FIG. 3A and FIG. 3B illustrate cross-sectional and bottom views, respectively, of a bond head 30 in accordance with some embodiments. FIG. 3A is taken along line A-A' in FIG. 3B. In those figures, a die (e.g., the integrated circuit die 10) is shown attached to the bond head 30 to illustrate the relationship between the bond head 30 and the die 10. As shown in FIGS. 3A and 3B, the bond head 30 includes a bond base 31, a chuck member 32, and an elastic material (or elastomer) 33.

The bond base 31 is adapted to attach or mount to a bonder which is part of a pick-and-place tool (not shown). The chuck member 32 (e.g., the portion below the dashed line L in FIG. 3A) protrudes from the bottom surface 31A of the bond base 31, and has a chuck surface 32A for holding fast the die 10 using differential air pressure. Vacuum channels 310 are formed (e.g., along the central axis C of the bond head 30) to penetrate the bond base 31 and chuck member 32 and extend to the chuck surface 32A to form vacuum holes 320 (see FIG. 3B). When a vacuum source (not shown) is activated, a vacuum environment is created in the connecting vacuum channels 310, and a vacuum force can be generated from the vacuum holes 320 to attract the die 10 to the chuck surface 32A of the bond head 30. In the embodiments of FIG. 3B, the vacuum holes 320 are arranged in two rows along opposite sides of the chuck surface 32A, but the disclosure is not limited thereto. Any other suitable arrangement of vacuum holes 320 can also be used. The shape of the chuck surface 32A may correspond to the shape of the die 10 in the plan view. For example, both the chuck surface 32A and die 10 have a rectangular (or square) cross-sectional shape, as shown in FIG. 3B.

The bond base 31 and chuck member 32 may both be rectangular plate structure. The chuck member 32 is located in and protruding from the central region of the bond base 31 and is spaced apart from the periphery 31P of the bond base 31, thereby forming a groove G in the vicinity of the periphery 31P of the bond base 31 and around the sidewall 32S of the chuck member 32. As another expression, the groove G is formed between the sidewall 32S of the chuck member 32 and the bottom surface 31A of the bond base 31. The sidewall wall 32S of the chuck member 32 is between and connected to the bottom surface 31A of the bond base 31 and the chuck surface 32A of the chuck member 32. In some embodiments, the bond base 31 and chuck member 32 are integrally formed from a hard material such as metal or ceramic.

As shown in FIG. 3B, the size (e.g., the cross-sectional area, parallel to the X-Y plane) of the chuck member 32 is smaller than the size of the bond base 31 and is larger than the size of the die 10 (i.e., the width W2 of the chuck member 32 is less than the width W1 of the bond base 31 and is greater than the width W3 of the die 10 in the direction parallel to the chuck surface 32A, as shown in FIG. 3A). In some other embodiments, the size (e.g., the cross-sectional area, parallel to the X-Y plane) of the chuck member 32 may be equal to the size of the die 10 (i.e., the width W2 of the chuck member 32 may be equal to the width W3 of the die 10 in the direction parallel to the chuck surface 32A). In some embodiments, the difference between the width W2 and width W3 may be in a range between 0 μm and 50 μmm, but the disclosure is not limited thereto. The chuck member 32 having the same or larger size than the attached die 10 helps address bonding issues at the die edges or die corners during the bonding process, which will be further described later with reference to FIG. 4A.

Figures 1, 3B:
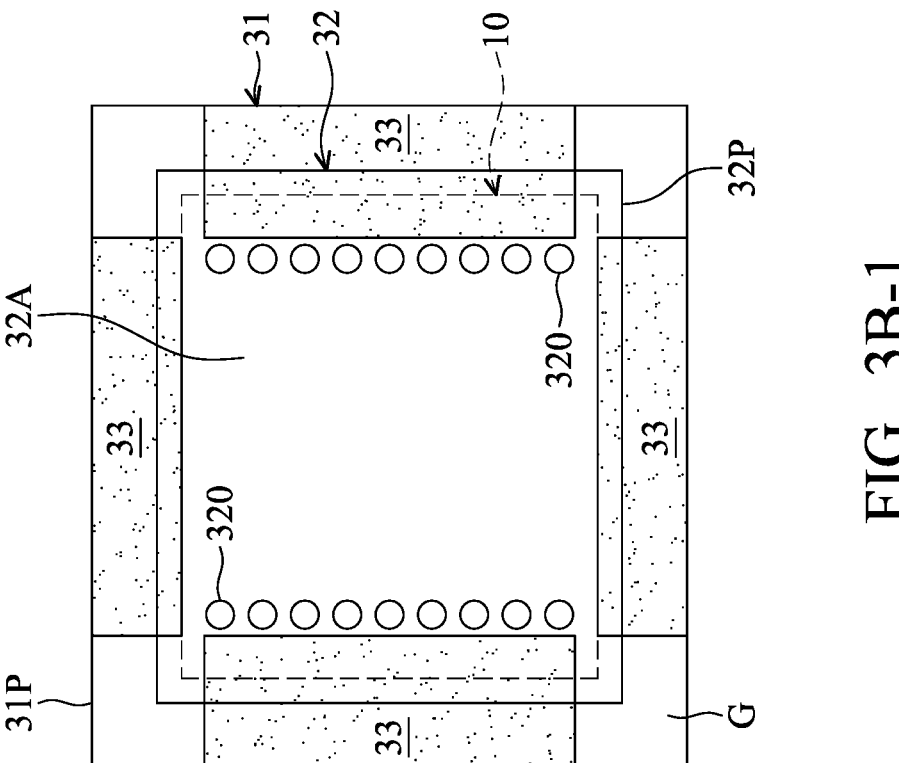

The elastic material 33 is disposed over the chuck surface 32A of the chuck member 32, and is used to prevent the chuck member 32 from impacting adjacent dies 10' already mounted on the wafer 20 during the bonding process, which will be further described later with reference to FIG. 4B. The elastic material 33 may be arranged along the periphery 32P of the chuck surface 32A. For example, in the embodiments shown in FIG. 3B, the elastic material 33 continuously extends along the entire periphery 32P of the chuck surface 32A to cover all edges and all corners of the chuck surface 32A (i.e., overlap all edges and all corners of the chuck surface 32A in the plan view). In some alternative embodiments, the elastic material 33 intermittently (i.e., discontinuously) extends along the entire periphery 32P of the chuck surface 32A to cover the edges and/or corners of the chuck surface 32A as required (e.g., to prevent collision). For example, the elastic material 33 may be arranged to cover only the edges of the chuck surface 32A (as shown in FIG. 3B-1), or may be arranged to cover only the corners of the chuck surface 32A (as shown in FIG. 3B-2), in some cases. Other suitable arrangement of elastic material 33 can also be used.

The elastic material 33 may further extend beyond the periphery 32P of the chuck surface 32A. For example, in some embodiments, the elastic material 33 may further extend into the groove G and along the sidewall 32S of the chuck member 32 and the bottom surface 31A of the bond base 31 to cover the sidewall 32S and the bottom surface 31A in the groove G, as shown in FIGS. 3A and 3B. Also, the elastic material 33 exposes the vacuum holes 320 and the central region of the chuck surface 32A located between the vacuum holes 320.

In some embodiments, the elastic material 33 may be a thermosetting plastic or thermoplastic, such as PET, PEEK, PEI, UPE, PPS, PAI, PPSU, PSU, PS, PTFE, PVDF, PI, etc., and may be formed over the chuck surface 32A of the chuck member 32, the sidewall 32S of the chuck member 32 and the bottom surface 31A of the bond base 31 by an adhesive or a deposition process (e.g., spin-on coating process or the like). Any other suitable materials and processes can also be used. In some embodiments, the thickness of the elastic material 33 may be in a range between 1 μm and 100 μm, but the disclosure is not limited thereto.

Figure 4A:
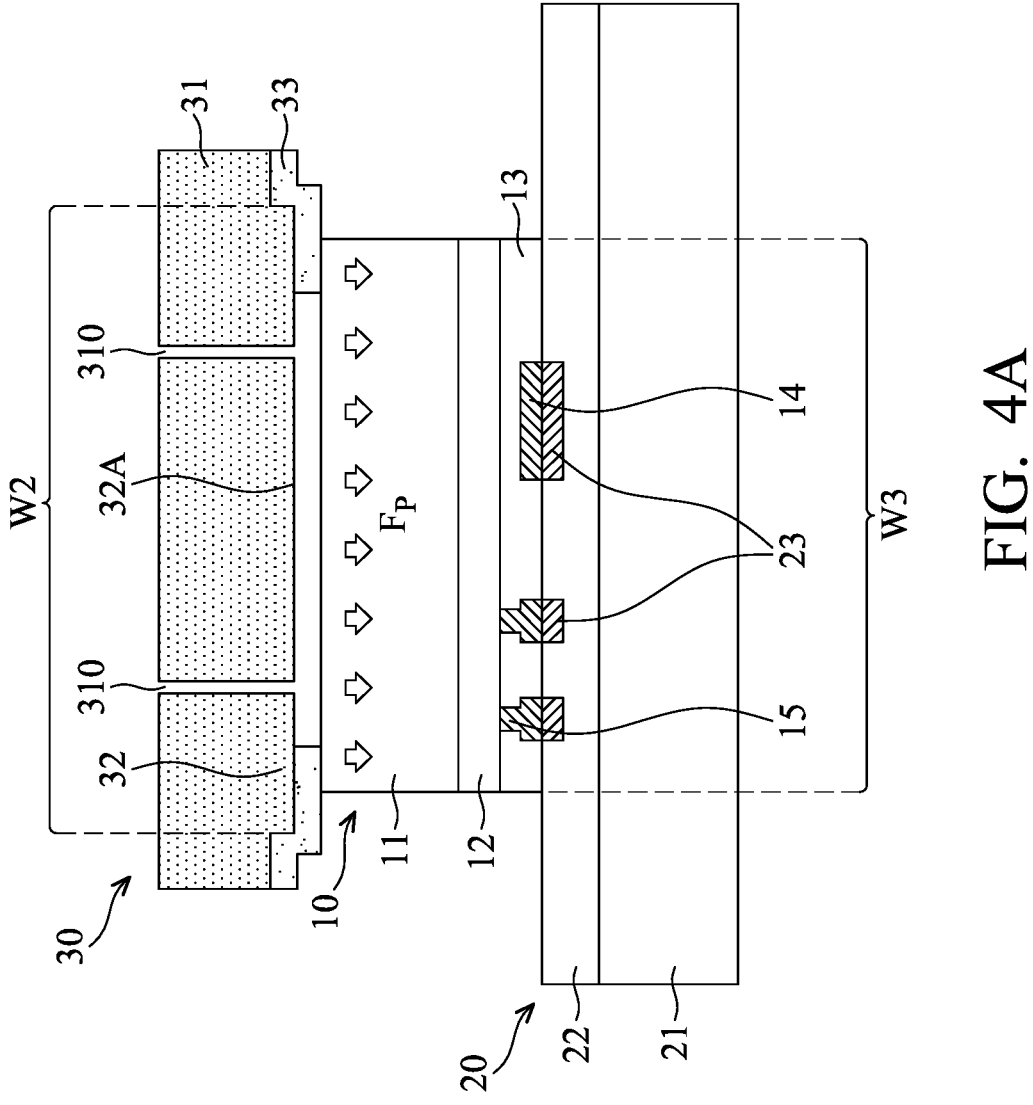
FIG. 4A illustrates a cross-sectional view of an intermediate stage in the formation of an integrated circuit package using a bond head in accordance with some embodiments of the present disclosure.

FIG. 4A illustrates bonding of an integrated circuit die 10 to a wafer 20 using the bond head 30 described above. As shown in FIG. 4A, since the chuck surface 32A of the bond head 30 has a larger size than the attached integrated circuit die 10 (e.g., W2>W3), the bond head 30 contacts the entire integrated circuit die 10 and therefore can provide sufficient pressure F_P at the die corners and die edges of the integrated circuit die 10 during the bonding process. Therefore, bonding issues at the die edges or die corners at the bonding interface between the integrated circuit die 10 and wafer 20 can be avoided, and the bonding quality can be improved. It should be understood that, although not shown separately, the chuck surface 32A of the bond head 30 having the same size as the attached integrated circuit die 10 may also avoid bonding issues at the die edges or die corners.

Figure 4B:
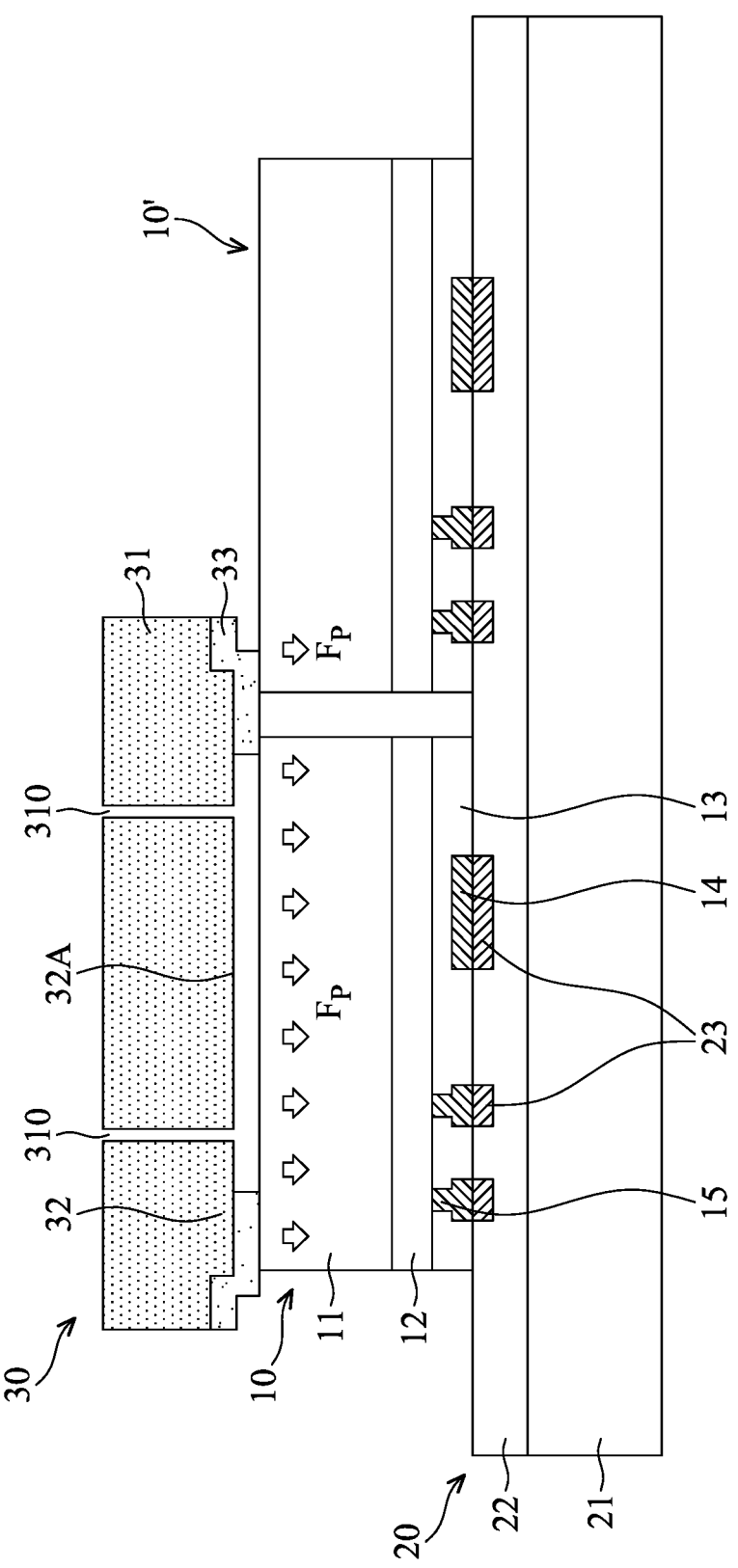
FIG. 4B illustrates a cross-sectional view of an intermediate stage in the formation of an integrated circuit package using a bond head, wherein bond head shift occurs, in accordance with some embodiments of the present disclosure.

FIG. 4B illustrates bonding of an integrated circuit die 10 to a wafer 20 using the bond head 30 described above, wherein bond head shift occurs due to abnormal bonder. As shown in FIG. 4B, even if the bond head 30 is displaced (relative to the attached integrated circuit die 10), the larger bond head 30 (or chuck surface 32A) can still press the die corners and die edges of the integrated circuit die 10 well during the bonding process, thereby avoiding undesired bonding issues at the die edges or die corners. Moreover, due to the provision of the elastic material 33 (between the chuck surface 32A and integrated circuit die 10), even if the shifted bond head 30 (e.g., the chuck surface 32A extending beyond the attached integrated circuit die 10) presses against an adjacent die 10' already mounted on the wafer 20 during the bonding process, it will not cause damage to the adjacent die 10' (i.e., to avoid die bumping). Conversely, the pressure F_P exerted by the shifted bond head 30 can help improve the bonding quality of the adjacent die 10'.

It should be appreciated that the elastic material 33 is not necessarily provided to cover all edges and all corners of the chuck surface 32A, and may be arranged according to the location of the dies 10, 10' on the wafer 20, in some cases. For example, if the pre-attached dies 10' are only close to the edges of the integrated circuit die 10 to be bonded, the elastic material 33 may be arranged to cover and protect only the edges of the chuck surface 32A (as shown in FIG. 3B-1) to prevent collision; and if the pre-attached dies 10' are only close to the corners of the integrated circuit die 10 to be bonded, the elastic material 33 may be arranged to cover and protect only the edges corners of the chuck surface 32A (as shown in FIG. 3B-2) to prevent collision.

Many variations and/or modifications can be made to embodiments of the disclosure. Some variations of some embodiments are described below.

Figures 5A, 5B, 5C, 5D, 5E, 5F:
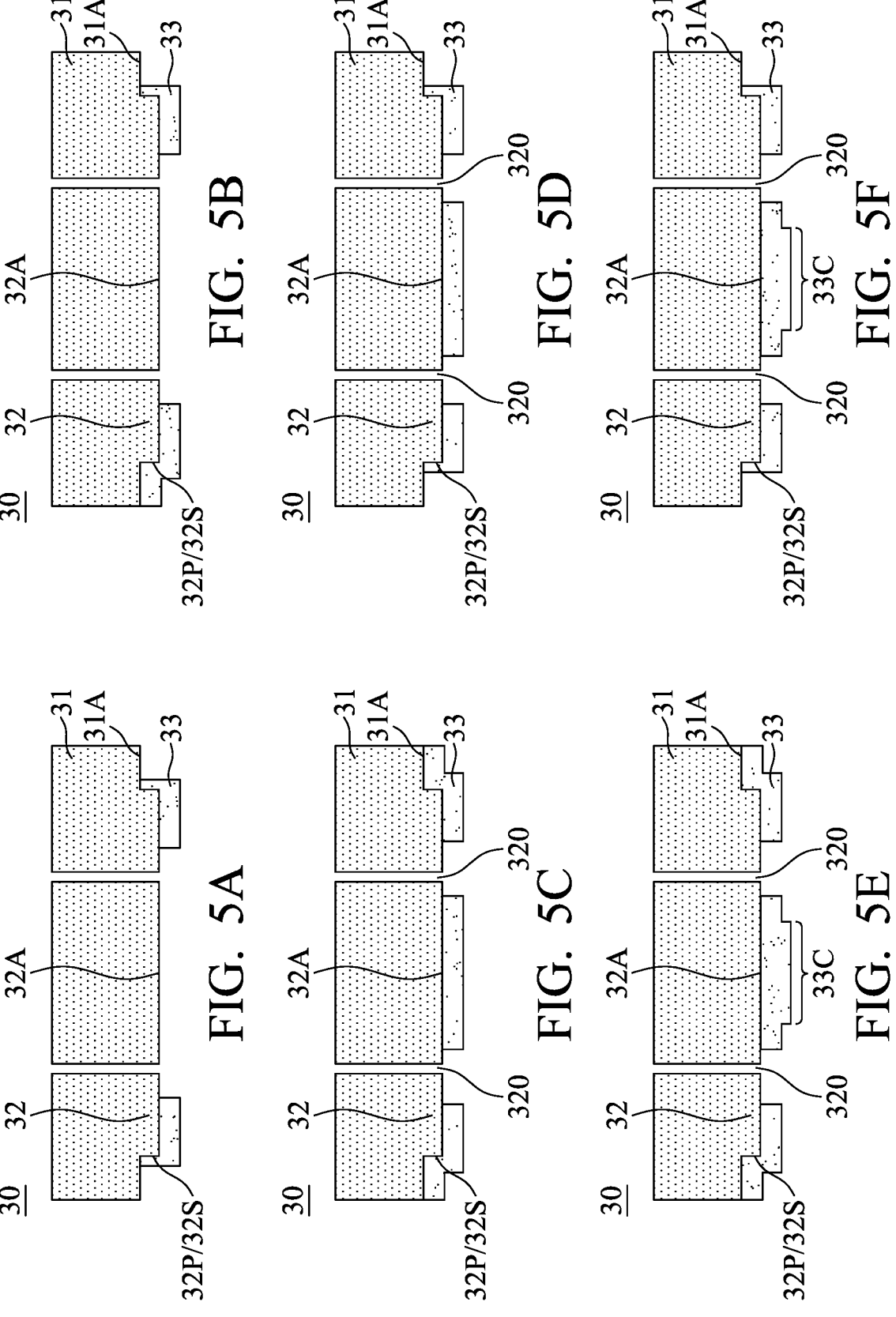
FIG. 5A illustrates a cross-sectional view of a bond head in accordance with some alternative embodiments of the present disclosure.
FIG. 5B illustrates a cross-sectional view of a bond head in accordance with some alternative embodiments of the present disclosure.
FIG. 5C illustrates a cross-sectional view of a bond head in accordance with some alternative embodiments of the present disclosure.
FIG. 5D illustrates a cross-sectional view of a bond head in accordance with some alternative embodiments of the present disclosure.
FIG. 5E illustrates a cross-sectional view of a bond head in accordance with some alternative embodiments of the present disclosure.
FIG. 5F illustrates a cross-sectional view of a bond head in accordance with some alternative embodiments of the present disclosure.

FIGS. 5A to 5F illustrate cross-sectional views of bond heads 30 in accordance with some alternative embodiments of the present disclosure. In FIG. 5A, the elastic material 33 is provided to only cover the periphery 32P of the chuck surface 32A and the sidewall 32S of the chuck member 32, and does not cover the bottom surface 31A of the bond base 31 in the groove G. In FIG. 5B, the elastic material 33 is arranged so to expose a part of the bottom surface 31A of the bond base 31 in the groove G. In FIG. 5C, the elastic material 33 is provided to cover the entire chuck surface 32A, and only the vacuum holes 320 are exposed from the elastic material 33. In FIG. 5D, the arrangement of the elastic material 33 is similar to that in FIG. 5C, and the difference is that the elastic material 33 exposes the bottom surface 31A of the bond base 31 in the groove G. In FIG. 5E, the arrangement of the elastic material 33 is similar to that in FIG. 5C, and the difference is that a center portion 33C (which corresponds to the central region of the chuck surface 32A) of the elastic material 33 is thicker than the remainder of the elastic material 33. Thicker center portion 33C is provided so as to match the profile of a curved die (i.e., with warpage) so that the curved die can be well attached to the bond head 30. In addition, due to the provision of the thicker center portion 33C, over-travel of the bond head 30 is also allowed during the bonding process, which helps to better bond curved dies to the wafer (especially at die edges and die corners). In FIG. 5F, the arrangement of the elastic material 33 is similar to that in FIG. 5E, and the difference is that the elastic material 33 exposes the bottom surface 31A of the bond base 31 in the groove G.

Figure 6A:
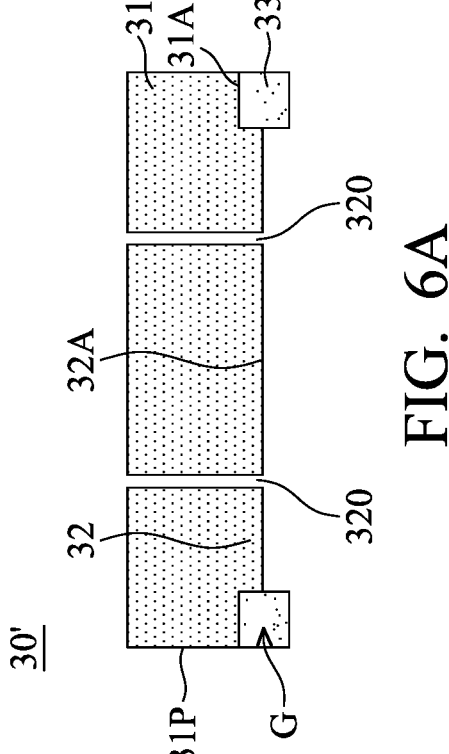
FIG. 6A illustrates a cross-sectional view of a bond head in accordance with some other embodiments of the present disclosure.
Figure 6B:
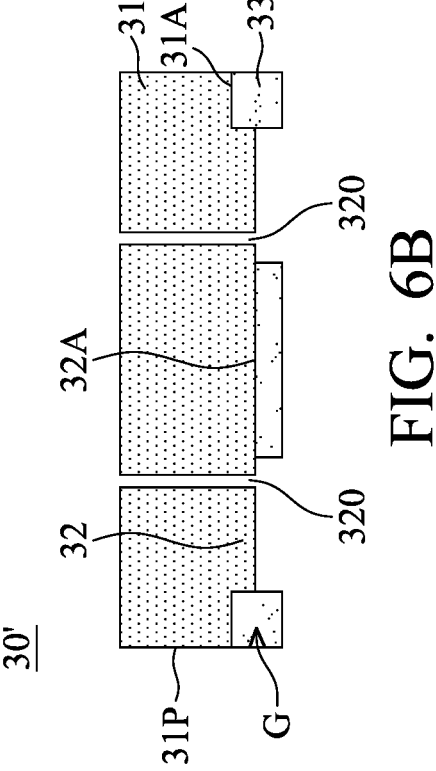
FIG. 6B illustrates a cross-sectional view of a bond head in accordance with some other embodiments of the present disclosure.

FIG. 6A and FIG. 6B illustrates cross-sectional views of bond heads 30' in accordance with some other embodiments of the present disclosure. In FIG. 6A, the elastic material 33 is provided only in the groove G adjacent to the periphery 31P of the bond base 31, and the elastic material 33 extends beyond the chuck surface 32A of the chuck member 32. This also allows over-travel of the bond head 30' during the bonding process, which helps to better bond curved dies to the wafer. In FIG. 6B, the arrangement of the elastic material 33 is similar to that in FIG. 6A, and the difference is that the elastic material 33 covers the central region of the chuck surface 32A.

Figures 7A, 7B, 7C:
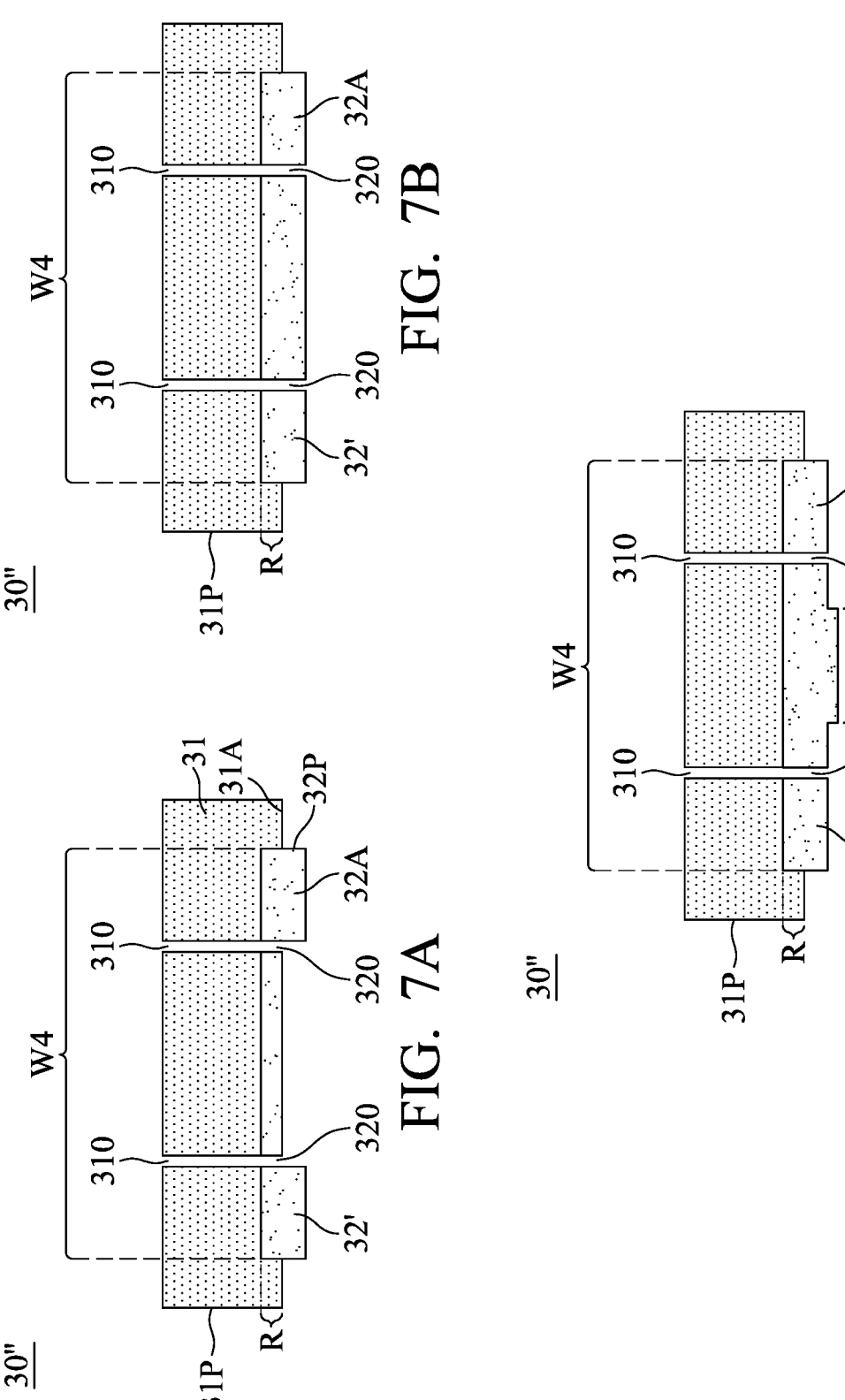
FIG. 7A illustrates a cross-sectional view of a bond head in accordance with some other embodiments of the present disclosure.
FIG. 7B illustrates a cross-sectional view of a bond head in accordance with some other embodiments of the present disclosure.
FIG. 7C illustrates a cross-sectional view of a bond head in accordance with some other embodiments of the present disclosure.

FIGS. 7A to 7C illustrates cross-sectional views of bond heads 30" in accordance with some other embodiments of the present disclosure. In those embodiments, the bond heads 30" includes a bond base 31 and a chuck member 32'. The bond base 31 is formed from a hard material such as metal or ceramic, and has a recess R formed on the bottom surface 31A of the bond base 31. The recess R may be located in the central region of the bond base 31 and spaced apart from the periphery 31P of the bond base 31. The chuck member 32' is made of an elastic material and received in the recess R of the bond base 31. The elastic material may be a thermosetting plastic or thermoplastic, such as PET, PEEK, PEI, UPE, PPS, PAI, PPSU, PSU, PS, PTFE, PVDF, PI, or the like. In some embodiments, the chuck member 32' is formed using a damascene process. As an example of such a process, the chuck member 32' may be formed by forming the recess R in the bond base 31 by, for example, etching, milling, laser techniques, a combination thereof, and/or the like. An elastic material is then filled in the recess R of the bond base 31 and over the bottom surface 31A of the bond base 31 through a deposition process (e.g., spin-on coating process or the like). A patterning process (e.g., photolithography and/or etching process) may be performed on the elastic material to form various surface profiles of the chuck member 32' (FIGS. 7A to 7C). The bond head 30" also has vacuum channels 310 penetrating the bond base 31 and chuck member 32' and vacuum holes 320 exposed at the chuck surface 32A of the chuck member 32' for holding fast a die or chip using differential air pressure, similar to those embodiments discussed above.

In FIG. 7A, the chuck surface 32A includes a protruding portion that extends beyond the bottom surface 31A of the bond base 31, where the protruding portion will first contact the attached die (not shown). The protruding portion may be adjacent to the periphery 32P of the chuck surface 32A. For example, in some embodiments (not shown), the protruding portion may extend continuously or intermittently (i.e., discontinuously) along the periphery 32P of the chuck surface 32A, similar to the embodiments illustrated in FIGS. 3B, 3B-1 and 3B-2. In some embodiments, the width W4 (measured between opposite outermost sidewalls) of the protruding portion of the chuck surface 32A is less than the width W1 of the bond base 31 (see FIG. 3A) and is greater than the width W3 of the die 10 (see FIG. 3A) in the direction parallel to the chuck surface 32A. This helps improve bonding quality by avoiding bonding issues at the die edges or die corners, similar to the embodiments illustrated in FIGS. 3A to 4A. Moreover, since the chuck member 32' is made of an elastic material, it also avoids die bump issues illustrated in FIG. 4B. In FIG. 7B, the entire chuck surface 32A extends beyond the bottom surface 31A of the bond base 31. In FIG. 7C, the center portion 32C (which corresponds to the central region of the chuck surface 32A) of the chuck member 32' is thicker than the remainder of the chuck member 32'. This helps the curved die to attach well to the bond head 30'', similar to the embodiments illustrated in FIG. 5E. In some other embodiments (not shown), the entire bond head, including the bond base and the chuck member, may be formed from an elastic material such as a thermosetting plastic or thermoplastic.

It should be understood that the geometries, configurations and the manufacturing methods described herein are only illustrative, and are not intended to be, and should not be constructed to be, limiting to the present disclosure. Many alternatives and modifications will be apparent to those skilled in the art, once informed by the present disclosure.

Next, referring back to FIG. 1D, after the integrated circuit die 10 is bonded to the wafer 20, an encapsulant 25 is formed over the wafer 20 and around the integrated circuit die 10. The encapsulant 25 may be a molding compound, epoxy, or the like, and may be applied by compression molding, transfer molding, or the like. The encapsulant 25 may be formed over the wafer 20 and integrated circuit die 10 such that they are buried or covered. The encapsulant 25 is then cured. In some embodiments, a planarization process (not shown) is performed on the encapsulant 25 to partially remove the encapsulant 25, until the top surface of the integrated circuit die 10 is exposed. After the planarization process, the top surface of the integrated circuit die 10 is level with the top surface of the encapsulant 25, as shown in FIG. 1D. In some other embodiments, the top surface of the integrated circuit die 10 is still buried in the encapsulant 25 after the planarization process. The planarization process may include a grinding process, a CMP process, an etching process, a dry polishing process, one or more other applicable processes, or a combination thereof.

A singulation process (not shown) is then performed, wherein the resulting structure of FIG. 1D is sawed along scribed lines (not shown) to form a plurality of identical packages. One of the packages is shown in FIG. 1D, including a wafer 20, an integrated circuit die 10, and an encapsulant 25. This package is a chip-on-wafer (CoW) package. Although the bond head embodiments described above are used to form a CoW package, they may also be used to form other 3DIC packages.

In summary, the embodiments of the present disclosure have some advantageous features. By providing a larger bond head/chuck surface than the attached die, it can improve bonding quality by reducing bonding issues at the die edges or die corners. Additionally or alternatively, by providing an elastic material around the periphery (e.g., edges and/or corners) of the bond head/chuck surface, it can prevent the bond head from impacting adjacent dies already mounted on the bottom wafer during the bonding process, which will lead to die damage and particle contamination, resulting in yield loss of the bonding process. Accordingly, the reliability of the bonding process and the resulting semiconductor device can thus be increased. In some cases where bond head shift occurs, the shifted bond head also compress the corners and edges of adjacent die(s) without damaging them (due to the provision of elastic material), which helps improve adjacent dies bonding quality.

In accordance with some embodiments, a bond head is provided. The bond head includes a bond base, a chuck member, and an elastic material. The chuck member protrudes from the surface of the bond base, and has a chuck surface formed with vacuum holes for holding a die using differential air pressure. In the direction parallel to the chuck surface, the width of the chuck surface is less than the width of the bond base and is equal to or greater than the width of the die. The elastic material is disposed over the chuck surface. The elastic material is arranged around the periphery of the chuck surface to cover edges and/or corners of the chuck surface.

In accordance with some embodiments, a method is provided. The method includes obtaining a bond head, wherein the bond head includes a bond base, a chuck member, and an elastic material. The chuck member protrudes from the surface of the bond base, and has a chuck surface formed with vacuum holes. The elastic material is disposed over the chuck surface, and arranged around the periphery of the chuck surface. The method also includes attracting a first die to the chuck surface of the bond head using a vacuum force generated from the vacuum holes, with the elastic material interposed between the chuck surface and the first die. In the direction parallel to the chuck surface, the width of the chuck surface is less than the width of the bond base and is equal to or greater than the width of the first die. In addition, the method includes attaching the first die to a wafer using the bond head. A second die is pre-attached to the wafer and close to the first die. The elastic material is configured to protect the second die from being damaged by the chuck surface extending beyond the first die during the attaching of the first die.

In accordance with some embodiments, a bond head is provided. The bond head includes a bond base and a chuck member. The bond base includes a recess formed on the surface of the bond base. The chuck member is made of an elastic material and received in the recess. The chuck member has a chuck surface formed with vacuum holes for holding a die using differential air pressure. The chuck surface includes a protruding portion that extends beyond the surface of the bond base. In the direction parallel to the chuck surface, the width of the protruding portion is less than the width of the bond base and is equal to or greater than the width of the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bond head, comprising:
a bond base;
a chuck member protruding from a surface of the bond base, wherein the chuck member has a chuck surface formed with vacuum holes for holding a die using differential air pressure, wherein in a direction parallel to the chuck surface, a width of the chuck surface is less than a width of the bond base and is equal to or greater than a width of the die; and
an elastic material disposed over the chuck surface, wherein the elastic material is arranged around a periphery of the chuck surface to cover edges and/or corners of the chuck surface, and
wherein the elastic material also includes a center portion covering a central region of the chuck surface, and the center portion of the elastic material is thicker than a remainder of the elastic material.

2. The bond head as claimed in claim 1, wherein the elastic material continuously extends along the entire periphery of the chuck surface to cover all the edges and all the corners of the chuck surface.

3. The bond head as claimed in claim 2, wherein the elastic material overlaps all the edges and all the corners of the chuck surface in a plan view.

4. The bond head as claimed in claim 1, wherein a shape of the chuck surface corresponds to a shape of the die in a plan view.

5. The bond head as claimed in claim 1, wherein the chuck member is located in a central region of the bond base and spaced apart from a periphery of the bond base,
wherein there is a groove proximate to the periphery of the bond base and around a sidewall of the chuck member, and the groove is formed between the sidewall of the chuck member and the surface of the bond base, and the sidewall of the chuck member is between and connected to the surface of the bond base and the chuck surface, and
wherein the elastic material extends beyond the periphery of the chuck surface and into the groove to cover the sidewall of the chuck member.

6. The bond head as claimed in claim 5, wherein the elastic material further extends along and covers the surface of the bond base in the groove.

7. The bond head as claimed in claim 1, wherein the elastic material covers the entire chuck surface, and only the vacuum holes are exposed from the elastic material.

8. The bond head as claimed in claim 1, wherein the bond base and the chuck member are integrally formed from a first material that is harder than the elastic material, and the first material includes metal or ceramic.

9. The bond head as claimed in claim 1, wherein the elastic material is thermosetting plastic or thermoplastic.

10. A bond head, comprising:
a bond base;
a chuck member protruding from a surface of the bond base, wherein the chuck member has a chuck surface with vacuum holes formed therein for holding a die using vacuum force, wherein in a plan view, a cross-sectional view area of the chuck surface is equal to or greater than a cross-sectional view area of the die; and an elastic material disposed over the chuck surface, wherein the elastic material is arranged around a periphery of the chuck surface, and
wherein the elastic material also includes a center portion covering a central region of the chuck surface, and the center portion of the elastic material is thicker than a remainder of the elastic material.

11. The bond head as claimed in claim 10, wherein the chuck member is located in a central region of the bond base and the periphery of the chuck surface is spaced apart from a periphery of the bond base,
wherein there is a groove proximate to the periphery of the bond base and around a sidewall of the chuck member, and
wherein the elastic material extends beyond the periphery of the chuck surface and into the groove to cover the sidewall of the chuck member and the surface of the bond base in the groove.

12. The bond head as claimed in claim 10, wherein the elastic material covers the entire chuck surface, and only the vacuum holes are exposed from the elastic material.

13. The bond head as claimed in claim 10, wherein the bond base and the chuck member are integrally formed from a first material that is harder than the elastic material.

14. The bond head as claimed in claim 10, further comprising vacuum channels penetrating the bond base and the chuck member and connected to the vacuum holes.

15. A bond head, comprising:
a bond base;
a chuck member protruding from a surface of the bond base, wherein the chuck member has a chuck surface with vacuum holes formed therein for holding a die using vacuum force, wherein the chuck member is located in a central region of the bond base and is spaced apart from a periphery of the bond base, wherein there is a groove proximate to the periphery of the bond base and around a sidewall of the chuck member; and
an elastic material disposed over the chuck surface, wherein the elastic material is arranged around a periphery of the chuck surface and further extends into the groove, and
wherein the elastic material also includes a center portion covering a central region of the chuck surface, and the center portion of the elastic material is thicker than a remainder of the elastic material.

16. The bond head as claimed in claim 15, wherein the elastic material covers the sidewall of the chuck member and the surface of the bond base in the groove.

17. The bond head as claimed in claim 1, wherein the vacuum holes are arranged in two rows along opposite sides of the chuck surface.

18. The bond head as claimed in claim 17, wherein the vacuum holes are arranged on opposite sides of the center portion of the elastic material.

19. The bond head as claimed in claim 18, wherein in a cross-sectional view, a portion of the elastic material between the vacuum holes has a convex shape.

20. The bond head as claimed in claim 15, wherein the vacuum holes are arranged on opposite sides of the center portion of the elastic material, and in a cross-sectional view, a portion of the elastic material between the vacuum holes has a convex shape.

* * * * *